(12) United States Patent
Boyce

(10) Patent No.: US 6,831,838 B1
(45) Date of Patent: Dec. 14, 2004

(54) CIRCUIT BOARD ASSEMBLY FOR WELDING POWER SUPPLY

(75) Inventor: Martin J. Boyce, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/249,881

(22) Filed: May 14, 2003

(51) Int. Cl.[7] .............................................. H05K 7/20
(52) U.S. Cl. ...................... 361/719; 361/679; 361/687; 361/695; 174/16.1; 219/61.7
(58) Field of Search .................. 361/600, 668, 361/695, 699, 601, 622, 623, 641, 818, 836, 704–707, 717–719; 174/35 R, 16.1, 35 MS; 219/130.1, 132, 133, 61.7, 76.11, 86.31, 125.11, 126, 130.51; 363/141, 146, 144; 257/706, 707–726; 165/80.2, 80.3, 80.4, 165, 104.32, 104.33, 104.34

(56) References Cited

U.S. PATENT DOCUMENTS

| | | | | |
|---|---|---|---|---|
| 4,292,665 A | * | 9/1981 | Hersom et al. ............. | 363/141 |
| 4,403,102 A | * | 9/1983 | Jordan et al. ............... | 174/16.3 |
| 5,305,185 A | * | 4/1994 | Samarov et al. ............ | 361/704 |
| 5,307,236 A | * | 4/1994 | Rio et al. .................... | 361/720 |
| 5,642,260 A | * | 6/1997 | Sigl ............................ | 361/695 |
| 5,646,826 A | * | 7/1997 | Katchmar ................... | 361/704 |
| 5,747,773 A | * | 5/1998 | Griffin et al. ............ | 219/130.1 |
| 5,831,240 A | * | 11/1998 | Katooka et al. ......... | 219/130.1 |
| 6,081,423 A | * | 6/2000 | Griffin ........................ | 361/688 |
| 6,084,774 A | * | 7/2000 | Talbot et al. ............... | 361/704 |
| 6,088,226 A | | 7/2000 | Rearick | |
| 6,132,104 A | * | 10/2000 | Bliss et al. ................... | 385/53 |
| 6,195,266 B1 | | 2/2001 | Padgett et al. | |
| 6,304,450 B1 | * | 10/2001 | Dibene et al. .............. | 361/704 |
| 6,489,591 B1 | * | 12/2002 | Achtner ................... | 219/130.1 |

* cited by examiner

Primary Examiner—Michael Datskovsky
(74) Attorney, Agent, or Firm—Ziolkowski Patent Solutions Group, LLC

(57) ABSTRACT

A system and method for attaching multiple electrical components to a heat sink is disclosed. The apparatus includes a pair of spacers for each component. The spacers define a uniform distance between a circuit board and a base of a heat sink. Each spacer is secured to the circuit board and determines a distance from a base of the component to the circuit board. The heat sink is attached to the assembly by a plurality of threaded fasteners that extend through the circuit board, through a center space of the spacers and into threaded recesses of the heat sink.

33 Claims, 4 Drawing Sheets

CIRCUIT BOARD ASSEMBLY FOR WELDING POWER SUPPLY

BACKGROUND OF INVENTION

The present invention relates generally to welding systems and, more particularly, to a circuit board assembly located therein.

Welding power supply housings have a front panel which includes an on/off switch as well as controls such as power adjustment dials, output gauges, and output terminals and outlets. Additionally, the housing includes a rear panel and a cover panel. Such welding power supply housings must understandably enclose the entirety of the electrical components.

The electrical components include heat generating electrical components that require cooling. The housing, being fully enclosed however, restricts natural convection cooling of these electronic components. These components are preferably cooled by attaching the components directly to a heat sink. The heat sink is exposed to a cooling flow so that the cooling flow over the fins of the heat sink effectively cools those components that are attached thereto. Additionally, the cooling flow may be polluted with particulates related to the welding process and work environment. Sensitive components of the welding device can be damaged by exposure to the polluted cooling flow.

A wind tunnel, which extends through the housing of the welding device, can be used to maintain separation between the electrical components of the device and the cooling flow. These wind tunnels must be constructed with an opening therethrough. The heat sink of the electrical assembly can then be passed through the opening of the wind tunnel such that the fins of the heat sink are exposed to the cooling flow but the electrical components thereon are not. As such, the electrical components would not be exposed to the polluted cooling flow.

The connections between the electrical components of the welding device and the heat sinks need to be physically and thermally secure. The connection between the electrical components and the heat sinks also needs to be uniform and easily repeatable. Failure to have a uniform and repeatable connection between the electrical components and the heat sinks can result in thermal hot spots in the components. These hot spots can ultimately lead to premature failure of the individual components which in turn adversely affect the operability of welding-type device and can also lead to damage of other components of the welding device. To prevent the propagation of the hot spots, and in turn protect the life expectancy of the electrical components, such electrical components need to be in constant and secure contact with a heat sink.

Additionally, the components that generate excess heat and need to be attached to a heat sink are frequently located at different distances from the circuit board as a result of variations in the construction of the individual components. The different distance from the circuit board to the bases of these components have traditionally required that each of the components be attached to separate heat sinks. An electrical assembly that requires the individual electrical components be attached to individual heat sinks presents two significant drawbacks.

The first drawback is that such a construction increases the time and cost associated with manufacturing and assembling the welding-type devices. The second drawback of having multiple independent heat sinks is that such a construction transfers stresses to localized portions of the circuit board. Heat sinks are generally large and comparatively heavy components of the electrical assembly. Having multiple heat sinks allows the circuit board to flex along several axes. Flexing of the circuit board can result in damage to the circuit traces contained thereon.

Another consideration of any circuit board assembly is the method of connection employed in connecting the individual electrical components to the board. The electrical components can be mechanically and electrically connected to the board through a variety of methods. These methods of connection include hand soldering, mechanical connectors, and wave soldering, to name a few. Of these methods, the most preferable method of connecting electrical components to a circuit board is by wave soldering. This method yields a higher quality connection between the component and the circuit board compared to hand soldering and mechanical connections.

Space restrictions are also an important consideration in circuit board assemblies. Heat sinks are comparatively large components of an electrical assembly when compared to other electrical components of the assembly. The size of the heat sink is generally determined by the amount of heat required to be transferred from the respective components mounted thereto. Having the heat sink positioned within a perimeter of the circuit board prevents use of a portion of the circuit board. The portion of the circuit board located between a first electrical component attached to the circuit board and a first heat sink and an adjacent electrical component and the adjacent components respective heat sink is often inaccessible because of the close proximity of the heat sink to the circuit board.

Therefore, it would be desirable to design a system and method capable of attaching multiple electrical components to a circuit board while having the bases of the respective components thermally connected to a common heat sink and maintaining a consistent separation between the electrical components and the cooling flow. Additionally, it would be desirable to simplify the assembly process to have a system that allows for near completion of the electrical assembly prior to attachment of the heat sink to the electrical assembly and prior to attachment of the electrical assembly to a wind tunnel of the welding-type device.

BRIEF DESCRIPTION OF INVENTION

The present invention is directed to a circuit board assembly and method of assembly that solves the aforementioned problems. The present invention provides a system and method for a circuit board assembly preferably used in a welding type power supply having a wind tunnel extending through the housing to allow cooling of the various electrical components and at the same time isolates certain electrical components from particulates that may be carried in the cooling flow. Additionally, the present invention allows the preferred electrical components to be attached to the circuit board prior to attachment of a common heat sink to the circuit board and prior to installation of the circuit board assembly within the housing of the welding type device, which allows wave soldering of these devices to the circuit board. Upon attaching the electrical components to the circuit board, the common heat sink is attached thereto in thermal communication with each of the preferred electrical components.

Therefore, in accordance with one aspect of the present invention, a circuit board configuration in a welder type device includes a common heat sink and a housing having a wind tunnel therein. The wind tunnel has an opening sized to fit the heat sink therethrough. The welding type device includes a circuit board having more than one heat generating device mounted thereon. A plurality of spacers is arranged between the more than one heat generating devices and the circuit board to ensure that the more than one heat generating devices are in proper thermal communication with the common heat sink.

In accordance with another aspect of the present invention, an electrical assembly of a welding device includes a circuit board having a plurality of components connected thereon and a plurality of fastening holes therethrough. The electrical assembly also includes a plurality of sleeves. Each sleeve has an end with a reduced outer diameter that extends through each of the fastening holes of the circuit board. A plurality of fasteners extend through the plurality of fastening holes and sleeves and secures a heat sink to the circuit board via a plurality of threaded holes therein.

In accordance with a further aspect of the present invention, a method of assembling a circuit board assembly is disclosed that includes attaching a plurality of spacers to a circuit board, connecting a plurality of electrical components to a circuit of the circuit board, and mounting a heat sink to the circuit board in thermal communication with the plurality of electrical components.

In yet another aspect of the present invention, a circuit board kit is disclosed. The kit includes a circuit board having a plurality of fastener holes therethrough and a plurality of electrical components attached thereon. A single heat sink is attached to the circuit board and in thermal communication with the plurality of electrical components. The kit further includes a plurality of spacers swaged in the plurality of fastener holes of the circuit board thereby ensuring uniform connection between the plurality of electrical components and the single heat sink.

In another aspect of the present invention, an electrical assembly includes a common circuit board with a plurality of heat generating devices mounted thereon. The heat generating devices have a component side and a heat transfer side. The component side of the heat generating devices is arranged toward the common circuit board and the heat transfer side of the heat generating devices is opposite thereof. A common heat sink is mounted to the plurality of heat generating devices to dissipate heat therefrom. A support member is positioned between the common heat sink and common circuit board to maintain a fixed distance between the common heat sink and the common circuit board thereby maintaining uniform thermal communication between the common heat sink and the heat transfer side of the heat generating devices.

Therefore, the present invention provides cooling of the electrical components of a welding-type apparatus while maintaining a separation between the cooling flow and preferred electrical components. The present invention also provides for mounting multiple electrical components to a common heat sink after the components have been mounted to a common circuit board. The present invention also allows for construction of a nearly complete electrical assembly prior to the electrical assembly having a heat sink attached thereto and being mounted within the power supply housing. This configuration therefore allows for the use of wave soldering a majority of the connections to the electrical assembly.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
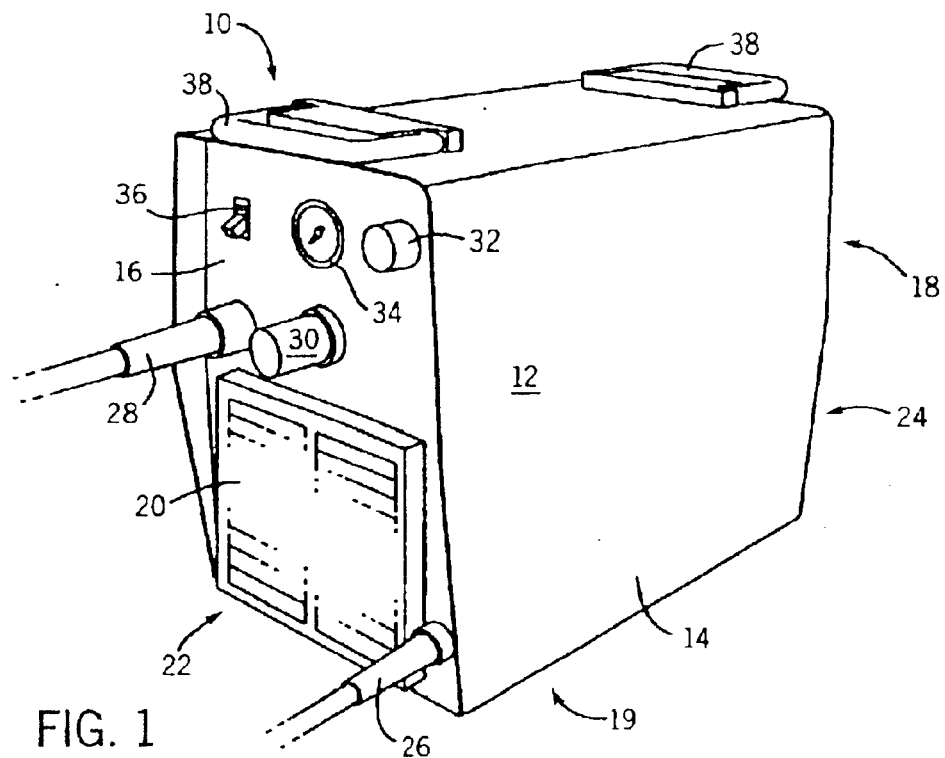
FIG. 1 is a perspective view of the welding power supply apparatus according to the present invention.

FIG. 1 shows a power supply 10 having a housing 12. The housing includes a cover 14, a front end panel 16; a rear end panel 18, and a base panel 19. Both the front and rear end panels 16, 18 include louvered openings 20. The end panels 16 and 18 include the louvered openings 20 to allow air to flow from a cooling inlet 22, through the power supply 10, and through a cooling exit 24. The cover 14 is attached to the front end panel 16, the rear end panel 18, and the base panel 19. FIG. 1 also shows: a welding ground lead 26, a welding power lead 28, a control knob 30, a power selector 32, an output gauge 34, and an on/off switch 36; all located in the front end panel 16. A pair of handles 38 is attached to the cover 14 to aid in moving the power supply 10.

Figure 2:
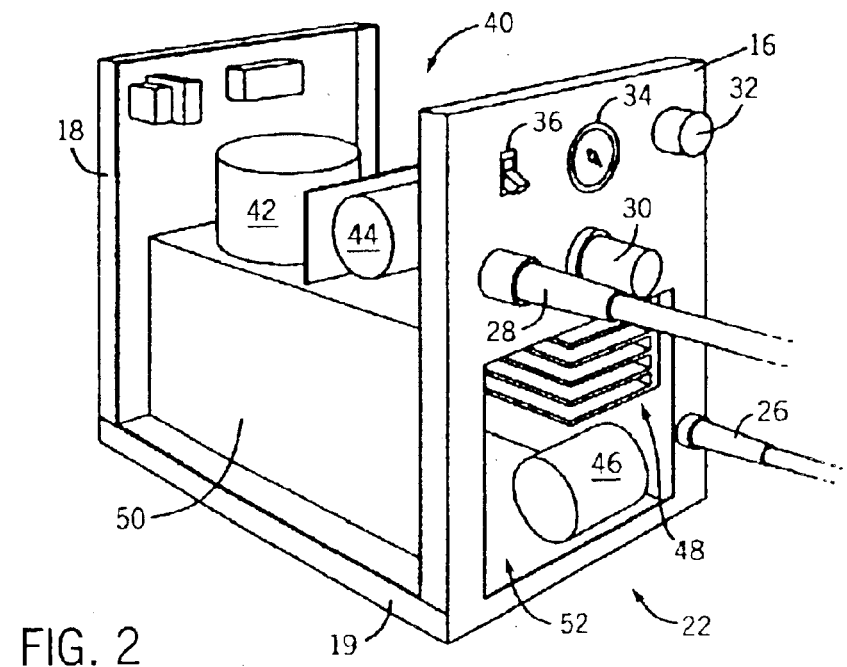
FIG. 2 is a rotated perspective view of that shown in FIG. 1 with the cover of the housing and the louvers of the end panel removed.

FIG. 2 shows the power supply 10 of FIG. 1 with the cover 14 removed to expose a component chamber 40. Component chamber 40 is the space located between the cover 14, the front end panel 16, the rear end panel 18, and the base panel 19. A wind tunnel 52 is located within component chamber 40 and located under a U-shaped panel 50, between the front end panel 16, the rear end panel 18, and base panel 19. Wind tunnel 52 defines a space for cooling air flow through the power supply 10. The U-shaped panel 50 is attached to the base panel 19 of the power supply 10 between the end panels 14, 16. Front end panel 16 is shown with louvered openings 20 removed to show a portion of an inside of the wind tunnel 52. This view shows a portion of a heat sink assembly 48 protruding into the wind tunnel 52. Also shown in FIG. 2 are electrical components 42, 44 attached to the U-shaped panel 50. Electrical components 42, 44 are those components that are preferably located in the component chamber 40 of the housing 12 and outside of the wind tunnel 52. Additionally, FIG. 2 shows an additional electrical device 46 that is representative of various components that may be located within wind tunnel 52 of the welder housing 12.

Figure 3:
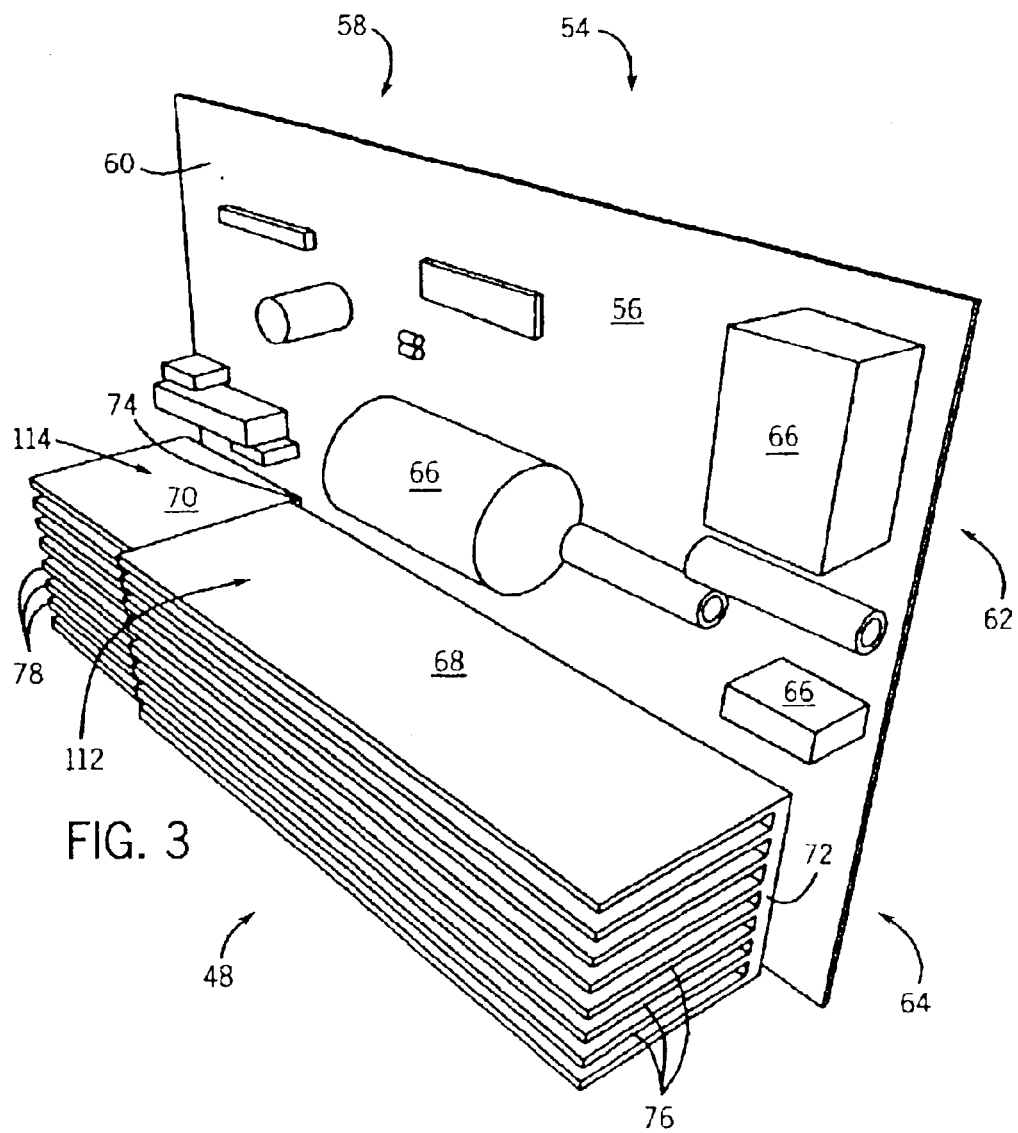
FIG. 3 is a perspective view of a circuit board assembly with a heat sink mounted thereon for use in the welding power supply apparatus of FIG. 2.

An exemplary circuit board assembly 54 is shown in FIG. 3. Circuit board assembly 54 includes a circuit board 56 that has a solder side 58 and a component side 60. Circuit board 56 also includes an upper portion 62 and a lower portion 64. Upper portion 62 of component side 60 of circuit board 56 includes a plurality of electrical components 66. Electrical components 66, as shown, are those components that are preferably mounted directly on circuit board 56 and do not require attachment to a heat sink. Electrical components 66 are those components that are preferably located within the component chamber 40 and attached to circuit board 56 but not in wind tunnel 52. The heat sink assembly 48 is attached to the lower portion 64 of the component side 60 of the circuit board 56. Heat sink assembly 48, in this embodiment, includes two heat sinks 68, 70, but could equivalently include one or more heat sinks.

Each heat sink 68, 70 has a base 72, 74 and a plurality of fins 76, 78. Fins 76, 78 are arranged to allow air flow thereover to cool the components that are in thermal communication therewith as will be described with respect to FIGS. 4 and 5. The heat sink bases 72, 74 are connected to circuit board 56 and are thereby in thermal communication with preferred electrical components located on the component side 60 of the circuit board 56. Heat sinks 68, 70 are attached to circuit board 56 with a plurality of electrical components located therebetween as is best shown in FIG. 4.

Figure 4:
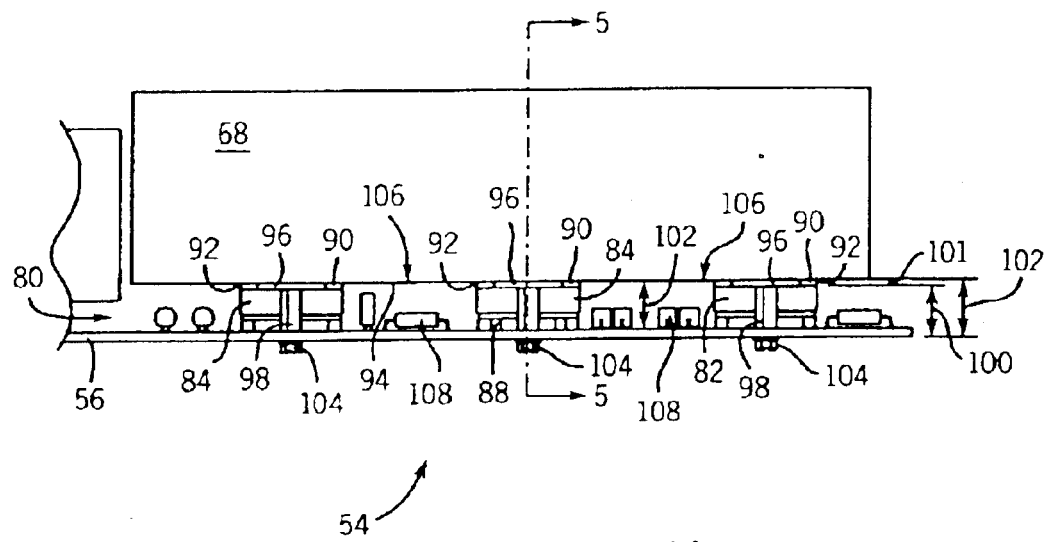
FIG. 4 is a bottom view of the circuit board assembly shown in FIG. 3.

FIG. 4 shows a bottom view of circuit board assembly 54 of FIG. 3. A plurality of heat generating electrical components 80 are attached to circuit board 56 and heat sink 68. Heat generating electrical components 80 are electrically attached to circuit board 56 via a plurality of component leads 88. Heat generating electrical components 80 can include several types. A rectifier 82 is one type of electrical component attached to circuit board 56 and heat sink 68. Another type of electrical component are power transistors, such as IGBTs 84. It is understood that, although the present invention is practiced with two specific types of heat generating electrical components in contact with the heat sink, having all the components of the same type, or having more than two types of components is contemplated and well within the scope of the appending claims.

Figure 5:
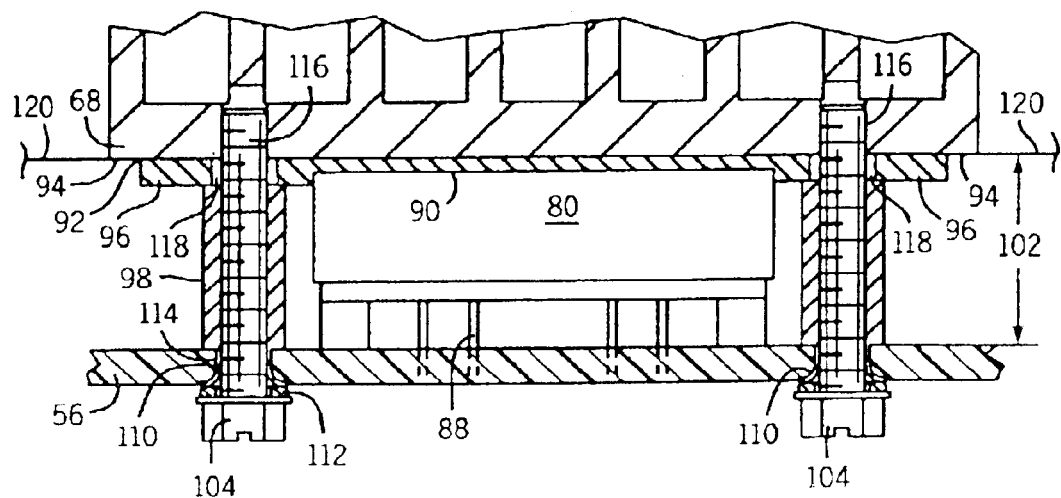
FIG. 5 is an end view of the circuit board assembly shown in FIG. 3 taken along the plane 5—5 shown in FIG. 4.

Each heat generating electrical component 80 has a base 90 having a connection face 92. Each connection face 92 of base 90 of heat generating electrical component 80 is in thermal engagement with a mounting face 94 of heat sink 68. Each base 90 of each heat generating electrical component 80 is in secure contact with heat sink 68. Each heat generating electrical component 80 also includes two flanges 96. As shown in FIG. 5, flanges 96 are located at opposite ends of components 80. Referring back to FIG. 4, circuit board assembly 54 also has a spacer 98 for each flange 96 of heat generating electrical components 80. Spacer 98 has a first section length 100 that, in addition to a thickness 101 of the base 90 of the heat generating electrical components 80, determines and ensures a uniform distance 102 between circuit board 56 and mounting face 94 of heat sink 68.

Heat sink 68 includes a plurality of threaded holes, which will be discussed in reference to FIG. 5 below, which receive a threaded fastener 104 therein. Each threaded fastener 104 passes through a spacer 98 which is attached to the circuit board 56. The threaded fastener 104 then passes through an opening in base 90 of the heat generating electrical components 80 and threadingly engages the heat sink 68. This construction secures heat sink 68 to circuit board 56 and ensures a planer engagement between connection face 92 of heat generating electrical components 80 and mounting face 94 of heat sink 68. Maintaining this engagement prevents the heat generating electrical components 80 from generating localized hot spots therewithin. Avoiding generation of such hot spots can extend the life of the heat generating electrical components. Additionally, having multiple components secured to a common sink distributes the weight of the sink over a larger area of the board and adds strength to the circuit board by minimizing flexing of the circuit board.

Also shown in FIG. 4 is a plurality of windows 106 that show efficient use of space on circuit board 56. Windows 106 are the area between adjacent heat generating electrical components 80, circuit board 56, and heat sink 68. Located in windows 106 are electrical devices 108 that are located, at least partially, between circuit board 56 and heat sink 68. Windows 106 allow for near complete usage of the available surface area of circuit board 56.

FIG. 5 shows a cross-section of one of the heat generating electrical components 80. Circuit board 56 includes a plurality of fastener openings 110. A second section 112 of spacer 98 is inserted into fastener opening 110 of circuit board 56. Second section 112 of spacer 98 is manufactured as a straight section. Second section 112 is inserted through fastener opening 110 until a shoulder 114 of spacer 98 contacts circuit board 56. Second section 112 of spacer 98 is then swaged so that the spacer 98 is securely attached to circuit board 56 at fastener opening 110. Heat generating electrical components 80 are temporarily secured to spacers 98 with component leads 88 passing through circuit board 56. Connection face 92 of each of the heat generating electrical components 80 is at a common distance 102 from circuit board 56. At this point, heat sink 68 is not attached to circuit board assembly 54. Referring back to FIG. 4, electrical devices 108 are also positioned on circuit board 56 in windows 106 between adjacent heat generating electrical components 80. The electrical components and connections positioned on the circuit board are then wave soldered to the board. The components wave soldered to circuit board 56 preferably include at least IGBTs 84, rectifier 82, electrical devices 108, and, as shown in FIG. 3, a plurality of electrical components 66. As such, nearly all of the components electrically connected to circuit board 56 are wave soldered thereto.

Referring back to FIG. 5, a thermal compound is applied to connection face 92 of heat generating electrical component 80 and heat sink 68 is secured thereto. Heat sink 68 includes a plurality of threaded holes 116. Heat sink 68 is positioned on heat generating electrical component 80 such that threaded holes 116 of heat sink 68 are coaxial with an opening 118 of base 90 of heat generating electrical component 80 which are coaxial with spacers 98 and fastener openings 110 of circuit board 56. Threaded fasteners 104 pass through fastener openings 110 of circuit board 56, spacers 98, opening 118 of component base 90, and engage threaded holes 116 of heat sink 68 thereby compressing mounting face 94 of heat sink 68 to connection face 92 of heat generating electrical component 80. This connection process is repeated at each flange 96 of those electrical components 82, 84 which are preferably thermally connected to heat sink 68. Such a connection ensures that each component will be independently secured to circuit board 56 and have a planar interface 120 of the connection face 92 of electrical components 82, 84 and mounting face 94 of heat sink 68.

Figure 6:
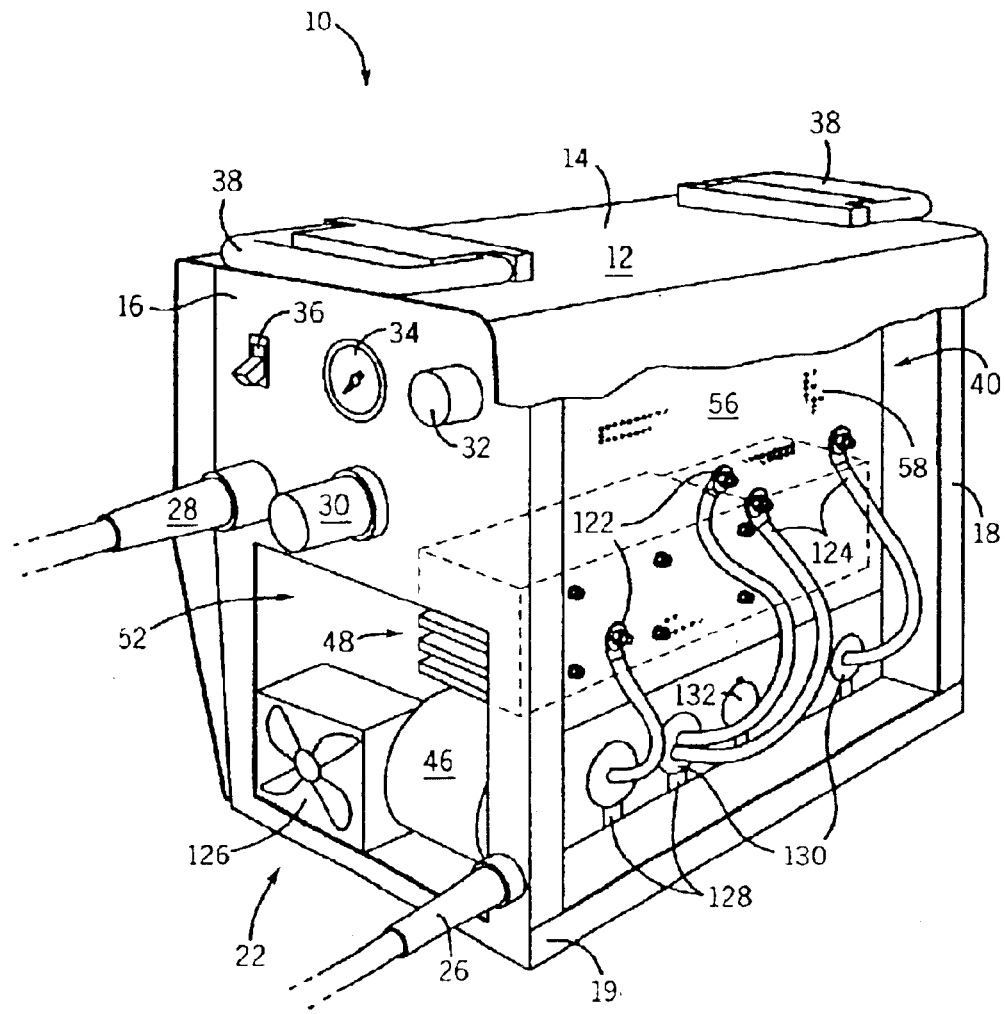
FIG. 6 is a perspective view similar to that shown in FIG. 1 with a portion of the housing cover broken away exposing a portion of a solder side of the circuit board.

FIG. 6 shows power supply 10 with a portion of cover 14 broken away. Solder side 58 of circuit board 56 is located between front end panel 16, rear end panel 18, base 19, and cover 14. FIG. 6 shows that the entirety of the solder side 58 of circuit board 56 of electrical assembly 54 is directly accessible after removal of cover 14 from housing 12. Circuit board 56 also includes a plurality of connector terminals 122. Connector terminals 122 electrically connect electrical components 46 to the circuit board 56 of circuit board assembly 54. Connector terminals 122, although not shown, can also electrically connect electrical components 42, 44 to the circuit board 56 of the circuit board assembly 54. Connector terminals 122 electrically connect those components that are not physically mounted to the circuit board 56 of the circuit board assembly 54 through connector cables 120. Connector cables 124 extend between the electrical components 42, 44, 46 and the connector terminals 122 of the circuit board 56 of the circuit board assembly of 54.

Also shown in FIG. 6 is front end panel 16 with louvered openings 20 removed to expose wind tunnel 52 therethrough. Electrical device 46, a fan 126, and a portion of heat sink assembly 48 are shown located within wind tunnel 52 of the power supply 10. Connector cables 124 from the electrical components 46 and fan 126 pass through openings 128, and terminate at connector terminals 122. Fan 126 and electrical components 46 are electrically connected to the circuit board assembly 54 via connector cables 124 that extend therefrom within the wind tunnel 52, through openings 128 of U-shaped panel 50 of housing 12 of power supply 10, and terminate at connector terminals 122 of circuit board 56 of circuit board assembly 54. Connector cables 124 also pass through a plug 130. Plugs 130 sealing connect connector cables 124 to openings 128 of U-shaped panel 50. Openings 128 that do not have a connector cable 124 passing therethrough are fitted with a solid plug 132.

Air flow through wind tunnel 52 passes over a plurality of fins 76, 78 of heat sink assembly 48 and electrical components 46 thereby cooling these elements by direct exposure to the cooling flow. Heat sink assembly 48 effectively cools heat generating electrical components 80, as shown in FIG. 4, that are attached to the circuit board 56 of circuit board assembly 54. Fan 126 is mounted in wind tunnel 52 to increase the cooling flow therethrough and over plurality of fins 76, 78 of heat sink(s) 68, 70 of heat sink assembly 48 to improve cooling of the heat sink assembly 48 and those components thermally connected thereto.

Therefore, in accordance with one embodiment of the present invention, a circuit board configuration in a welder type device includes a common heat sink and a housing having a wind tunnel therein. The wind tunnel has an opening sized to fit the heat sink therethrough. The welding type device includes a circuit board having more than one heat generating device mounted thereon. A plurality of spacers is arranged between the more than one heat generating devices and the circuit board.

In accordance with another embodiment of the present invention, an electrical assembly of a welding device includes a circuit board. The circuit board has a plurality of components connected thereon and a plurality of fastening holes therethrough. The electrical assembly also includes a plurality of sleeves. The sleeves have an end with a reduced outer diameter that extends through each of the fastening holes of the circuit board. A plurality of fasteners extend through the plurality of fastening holes and sleeves and secures a heat sink to the circuit board via a plurality of threaded holes therein.

In accordance with another embodiment of the present invention, a method of assembling a circuit board assembly is disclosed that includes attaching a plurality of spacers to a circuit board, connecting a plurality of electrical components to a circuit of the circuit board, and mounting ae heat sink to the circuit board in thermal communication with the plurality of electrical components.

In accordance with yet another embodiment of the present invention, a circuit board kit is disclosed. The kit includes a circuit board having a plurality of fastener holes therethrough and a plurality of electrical components attached thereon. A single heat sink is attached to the circuit board and in thermal communication with the plurality of electrical components. The kit further includes a plurality of spacers swaged in the plurality of fastener holes of the circuit board thereby ensuring uniform connection between the plurality of electrical components and the single heat sink.

In accordance with another embodiment of the present invention, an electrical assembly includes a common circuit board with a plurality of heat generating devices mounted thereon. The heat generating devices have a component side and a heat transfer side. The component side of the heat generating devices is toward the common circuit board and the heat transfer side of the heat generating devices is opposite thereof. A common heat sink is mounted to the plurality of heat generating devices. A support member is positioned between the common heat sink and common circuit board to maintain a fixed distance between the common heat sink and the common circuit board.

As one skilled in the art will fully appreciate, the heretofore description of welding devices not only includes welders, but also includes any system that requires high power outputs, such as heating and cutting systems. Therefore, the present invention is equivalently applicable with any device requiring high power output, including welders, plasma cutters, induction heaters, and the like. Reference to welding power, welding-type power, or welders generally, includes welding, cutting, or heating power. Description of a welding apparatus illustrates just one embodiment in which the present invention may be implemented. The present invention is equivalently applicable with many high power systems, such as cutting and induction heating systems, or any similar systems.

The present invention has been described in terms of the preferred embodiment, and it is recognized that equivalents, alternatives, and modifications, aside from those expressly stated, are possible and within the scope of the appending claims.

What is claimed is:

1. A circuit board configuration in a welder type device comprising:
    a common heat sink;
    a housing having a wind tunnel therein and an opening in the wind tunnel sized to fit the heat sink therethrough;
    circuit board having more than one heat generating device mounted thereon;
    a plurality of spacers arranged between the more than one heat generating devices and the circuit board; and
    wherein the more than one heat generating device is wave soldered to a solder side of the circuit board.

2. The circuit board configuration of claim 1 wherein the plurality of spacers have a height selected such that the common heat sink and the circuit board are a fixed distance apart.

3. The circuit board configuration of claim 1 wherein each of the plurality of spacers comprise an inner bore, a first outer diameter, and a second outer diameter, the second outer diameter constructed to pass through a fastener hole of the circuit board.

4. The circuit board configuration of claim 1 wherein the common heat sink has a plurality of threaded mounting holes and the circuit board configuration further comprised a plurality of threaded fasteners arranged to attach the circuit board to the common heat sink.

5. The circuit board configuration of claim 1 further comprising another heat sink mounted to the circuit board and arranged to fit in the wind tunnel opening.

6. The circuit board configuration of claim 1 further comprising a first and a second power transistor, and a rectifier.

7. The circuit board configuration of claim 1 wherein each heat generating device is mounted to the common heat sink with two fasteners through two spacers.

8. The circuit board configuration of claim 7 wherein the two fasteners are insertable into the circuit board on a side of the circuit board opposite a side of the circuit board containing the more than one heat generating devices.

9. A welding device having an electrical assembly comprising:
   a circuit board of the welder having a plurality of modules connected to a circuit thereon and a plurality of fastening holes therethrough;
   a sleeve having an end with a reduced outer diameter that extends through each of the fastening holes of the circuit board;
   a heat sink having a plurality of threaded holes therein; and
   a plurality of fasteners extendable through the plurality of fastening holes and sleeves securing the heat sink to the circuit board.

10. The welding device of claim 9 wherein the plurality of modules each have a base thermally attached to the heat sink.

11. The welding device of claim 10 wherein the modules include a pair of IGBT's and a rectifier.

12. The welding device of claim 10 wherein a distance between the heat sink and the circuit board is at least determined by a length of the sleeve.

13. The welding device of claim 10 wherein a distance between the heat sink and the circuit board is determined by a thickness of the base and a length of the sleeve.

14. The welding device of claim 10 wherein the base includes a pair of flanges attached to the heat sink and wherein the plurality of electrical components are attached to the circuit board.

15. The welding device or claim 9 wherein the sleeves have a first outer diameter and a second outer diameter wherein the second outer diameter is substantially similar to a diameter of the circuit board fastener holes.

16. The welding device of claim 9 wherein the heat sink threaded holes are aligned with the circuit board fastener holes.

17. The welding device of claim 9 further comprising a wind-tunnel having an opening constructed to allow the heat sink to pass therethrough.

18. The welding device of claim 9 further comprising a plurality of electrical components attached to the circuit board between the heat sink and the circuit board and not attached to the heat sink.

19. A method of assembling a circuit board assembly comprising:
   attaching a plurality of spacers to a circuit board;
   connecting a plurality of electrical components to a circuit of the circuit board;
   mounting a heat sink to the circuit board in direct thermal communication with the plurality of electrical components; and
   passing a plurality of threaded fasteners through the circuit board, through the plurality of spacers, through the plurality of electrical components, and into threaded engagement with a plurality of threaded holes in the heat sink.

20. The method of assembling a circuit board assembly of claim 19 further comprising flaring an end of the spacer to retain the spacer in the circuit board.

21. The method of assembling a circuit board assembly of claim 19 further comprising wave soldering the plurality of electrical components to the circuit board.

22. The method of assembling a circuit board assembly of claim 19 further comprising wave soldering at least two different types of the heat generating electrical components to the circuit board and attaching the heat sink thereto.

23. The method of assembling a circuit board assembly of claim 19 further comprising passing the heat sink through an opening of a housing and into a wind tunnel.

24. The method of assembling a circuit board assembly of claim 19 further comprising attaching the electrical components to the circuit board with temporary hardware and removing the temporary hardware after the electrical components are wave soldered to the circuit board.

25. The method of assembling a circuit board assembly of claim 19 further comprising attaching the circuit board to a welding-type device.

26. A circuit board kit comprising:
   a circuit board having a plurality of fastener holes therethrough;
   a plurality of electrical components attached to the circuit board;
   a shared heat sink attached to the circuit board and in thermal communication with the plurality of electrical components; and
   a plurality or spacers swaged in the plurality of fastener holes of the circuit board.

27. The circuit board kit of claim 26 wherein each spacer has a relatively thin end wall extending into the circuit board to allow deformation about the fastener holes in the circuit board.

28. The circuit board kit of claim 26 further comprising a bolt extending through each of the fastener holes of the circuit board and the spacers to secure the shared heat sink to the circuit board.

29. The circuit board kit of claim 26 installed in a welding-type device.

30. An electrical assembly comprising:
   a common circuit board;
   a plurality of heat generating devices mounted on the common circuit board on a component side and having a heat transfer side opposite the component side;
   a common heat sink mounted directly to the plurality of the heat generating devices;
   a support member positioned between the common heat sink and the common circuit board to maintain a fixed distance between the common heat sink and the common circuit board; and
   wherein the support member includes at least two spacers arranged between the common heat sink and the common circuit board and having mounting fasteners positioned therethrough.

31. A circuit board configuration in a welder type device comprising:
   a common heat sink;
   a housing having a wind tunnel therein and an opening in the wind tunnel sized to fit the heat sink therethrough;
   a circuit board having more than one heat generating device mounted thereon;
   a plurality of spacers arranged between the more than one heat generating devices and the circuit board; and
   wherein each of the plurality of spacers comprise an inner bore, a first outer diameter, and a second outer diameter, the second outer diameter constructed to pass through a fastener hole of the circuit board.

32. A circuit board configuration in a welder type device comprising:

a common heat sink;

a housing having a wind tunnel therein and an opening in the wind tunnel sized to fit the heat sink therethrough;

a circuit board having more than one heat generating device mounted thereon;

a plurality of spacers arranged between the more than one heat generating devices and the circuit board; and wherein the common heat sink has a plurality of threaded mounting holes and the circuit board configuration further comprised a plurality of threaded fastener arranged to attach the circuit board to the common heat sink.

33. A circuit board configuration in a welder type device comprising:

a common heat sink;

a housing having a wind tunnel therein and an opening in the wind tunnel sized to fit the heat sink therethrough;

a circuit board having more than one heat generating device mounted thereon;

a plurality of spacers arranged between the more than one heat generating devices and the circuit board; and wherein each heat generating device is mounted to the common heat sink with two fasteners through two spacers.

\* \* \* \* \*

UNITED STATES PATENT AND TRADEMARK OFFICE
CERTIFICATE OF CORRECTION

PATENT NO. : 6,831,838 B1
DATED : December 14, 2004
INVENTOR(S) : Martin J. Boyce It is certified that error appears in the above-identified patent and that said Letters Patent is hereby corrected as shown below:

Column 7,
Line 58, delete "ae" and substitute therefor the word -- a --;

Column 10,
Line 24, delete "or" substitute therefor -- of --.

Signed and Sealed this

Twenty-second Day of February, 2005

JON W. DUDAS
*Director of the United States Patent and Trademark Office*